United States Patent [19]
Nishi et al.

[11] Patent Number: 5,266,834
[45] Date of Patent: Nov. 30, 1993

[54] SEMICONDUCTOR DEVICE AND AN ELECTRONIC DEVICE WITH THE SEMICONDUCTOR DEVICES MOUNTED THEREON

[75] Inventors: Kunihiko Nishi; Michio Tanimoto; Toshihiro Yasuhara, all of Kokubunji; Katsuhiro Tabata, Higashimurayama; Yasuhiro Yoshikawa, Kodaira; Isao Akima, Fussa; Souichi Kunito, Kodaira; Toshio Nosaka, Musashimurayama; Hideaki Nakamura, Kodaira, all of Japan

[73] Assignees: Hitachi Ltd.; Hitachi VSLI Engineering Corp., Tokyo, Japan

[21] Appl. No.: 915,761

[22] Filed: Jul. 21, 1992

Related U.S. Application Data

[63] Continuation of Ser. No. 742,197, Aug. 5, 1991, abandoned, which is a continuation of Ser. No. 491,819, Mar. 12, 1990, abandoned.

[30] Foreign Application Priority Data

Mar. 13, 1989 [JP] Japan ................. 1-60436
Dec. 22, 1989 [JP] Japan ................. 1-3341378

[51] Int. Cl.⁵ .................................. H01L 23/02
[52] U.S. Cl. .................................. 257/706; 257/707; 257/723; 257/724; 257/729; 257/734; 257/735
[58] Field of Search .................. 357/81, 75, 68, 70, 357/82; 257/706, 707, 723, 724, 729, 734, 735

[56] References Cited

U.S. PATENT DOCUMENTS

| | | | |
|---|---|---|---|
| 3,629,672 | 12/1971 | Van De Water | 351/81 |
| 4,012,765 | 3/1977 | Lehner et al. | 351/81 |
| 4,398,235 | 8/1983 | Lutz et al. | 361/393 |
| 4,939,570 | 7/1990 | Bickford et al. | 351/81 |
| 5,068,712 | 11/1991 | Murakami et al. | 357/72 |

*Primary Examiner*—Robert J. Pascal
*Assistant Examiner*—R. A. Ratliff
*Attorney, Agent, or Firm*—Antonelli, Terry Stout & Kraus

[57] ABSTRACT

A package is provided for achieving higher packing density and higher circuit integration of memories, in particular, a structure is provided having a plurality of thin, surface mount packages which are stacked up. Each of the laminated packages includes a semiconductor pellet, leads fixed to the front surface of the pellet, a radiating plate fixed to the rear surface of the same, and a resin mold member. To achieve a stabilized laminated structure, the mold member is shaped into a convex form on the front side of the pellet and into a concave form on the rear side of the same, so that the concave portion of one package can engage with the convex portion of another package.

31 Claims, 11 Drawing Sheets

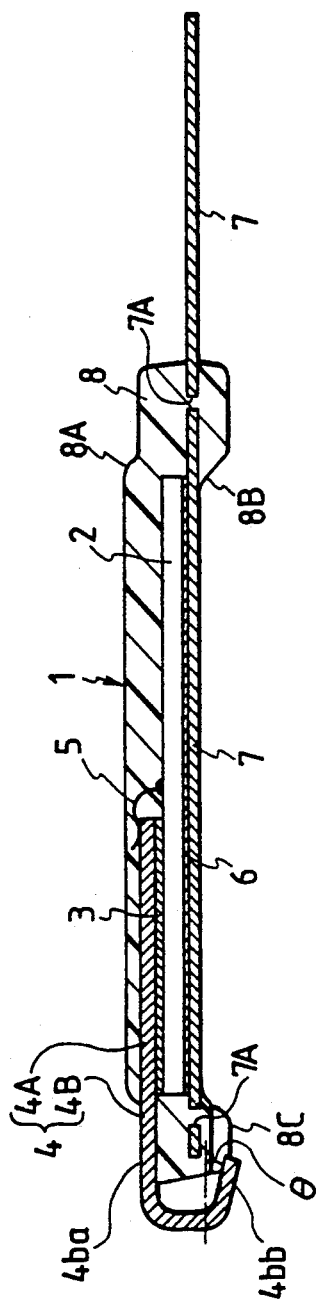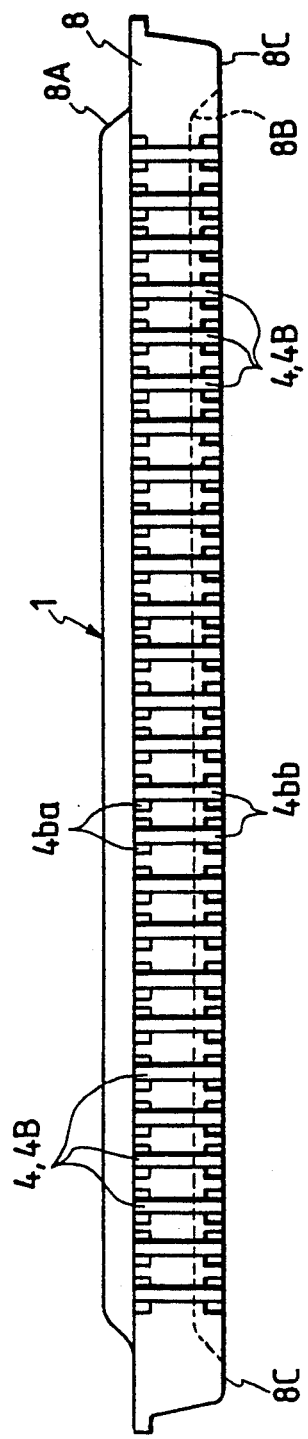

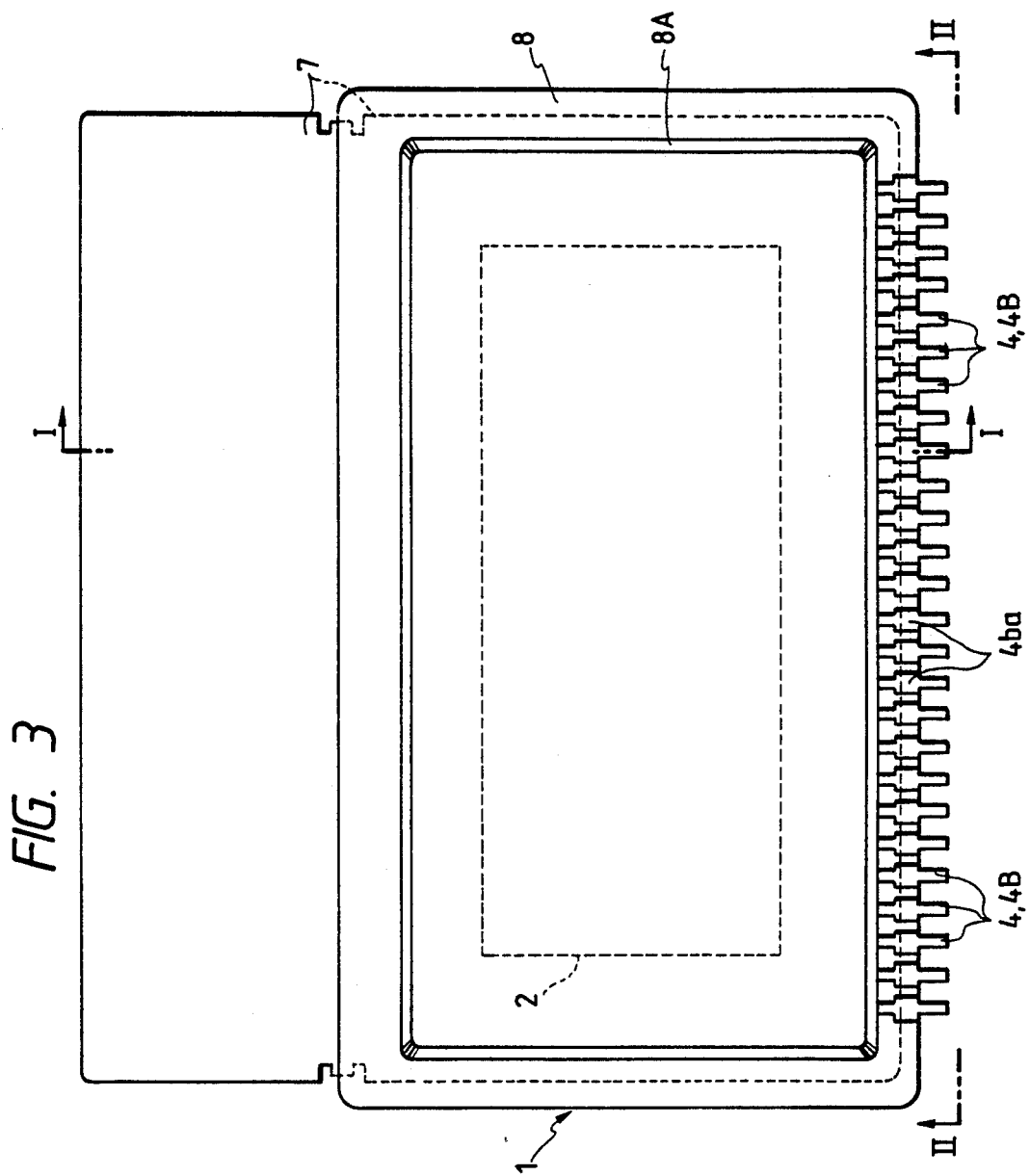

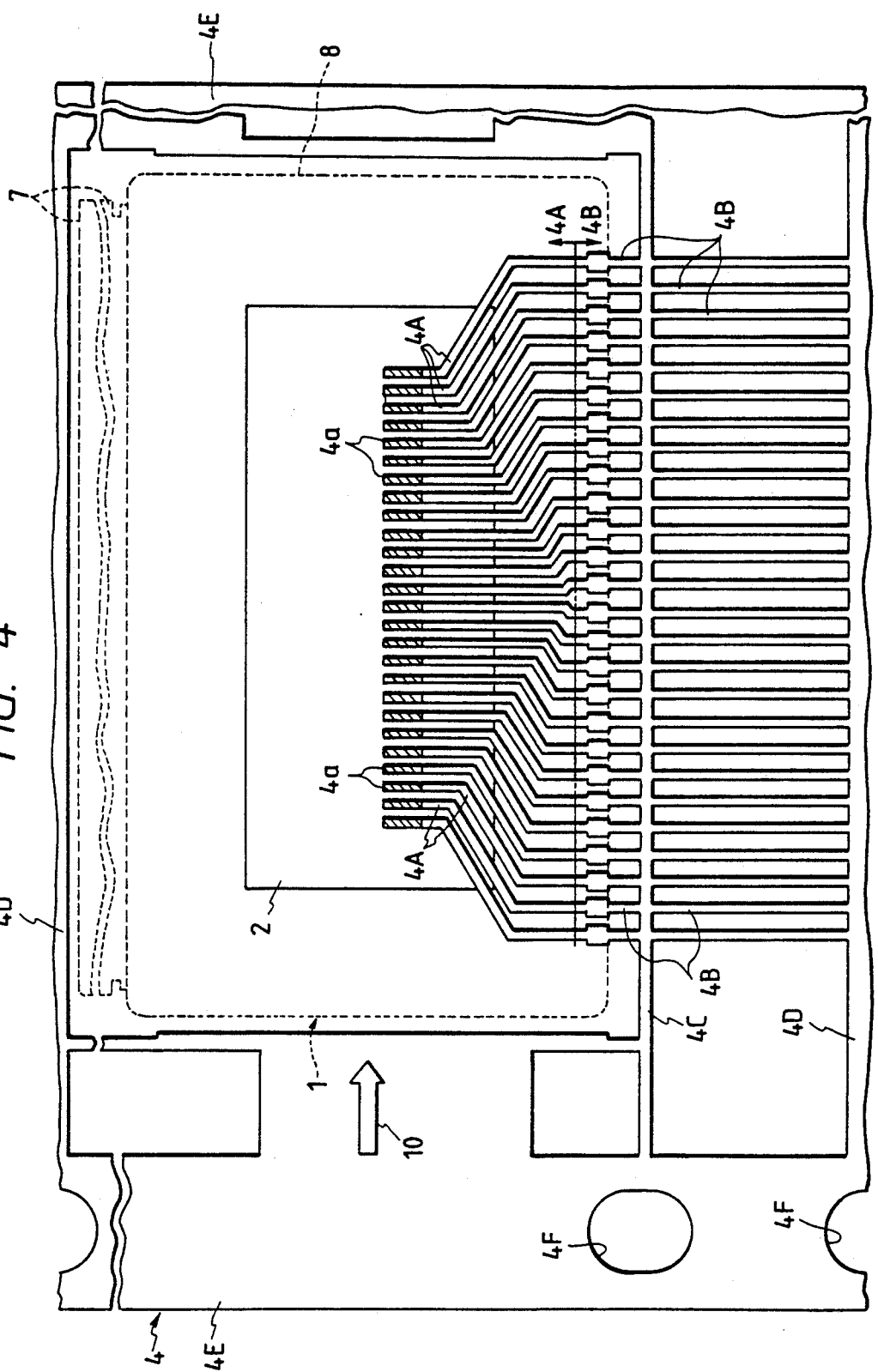

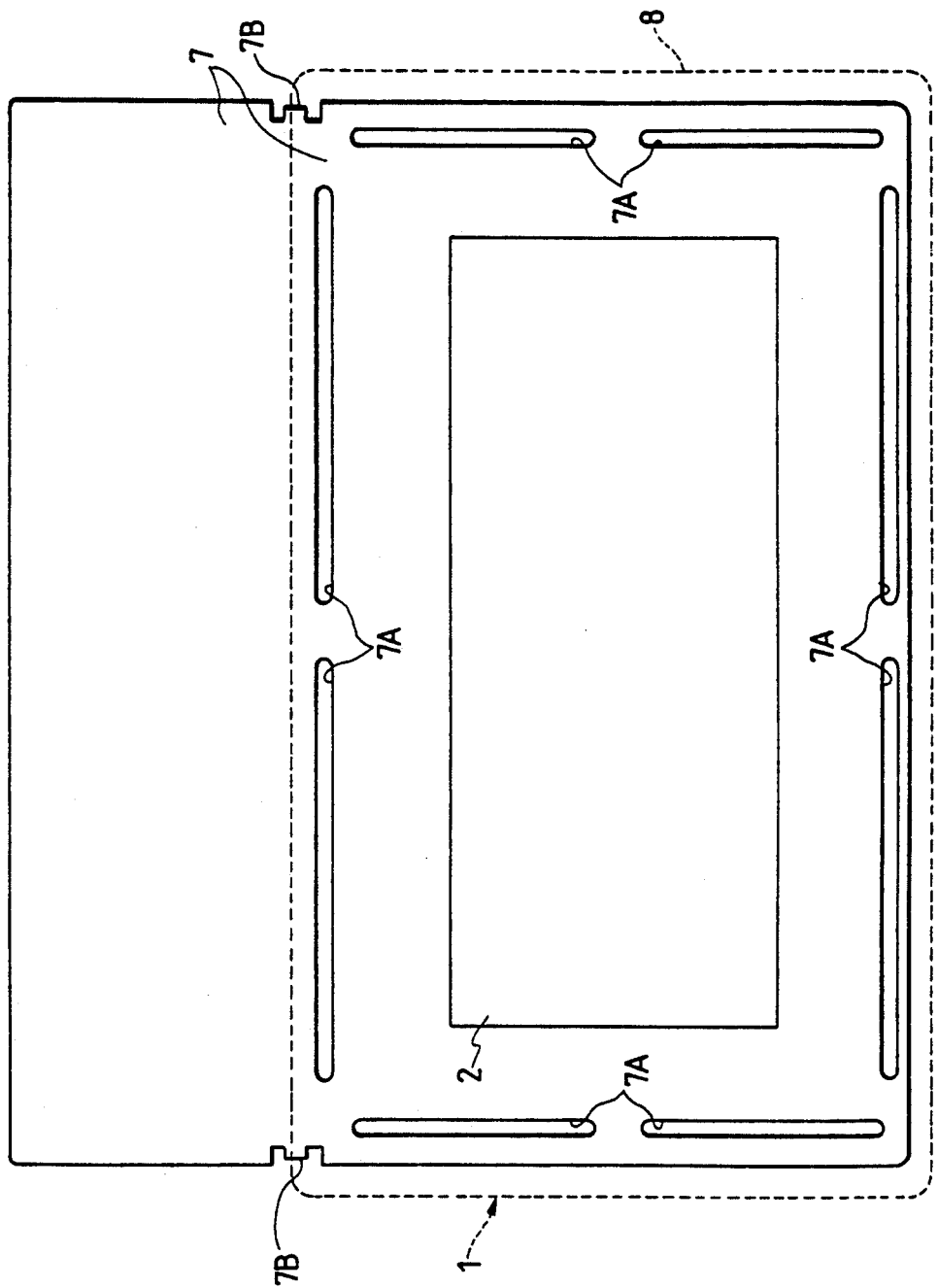

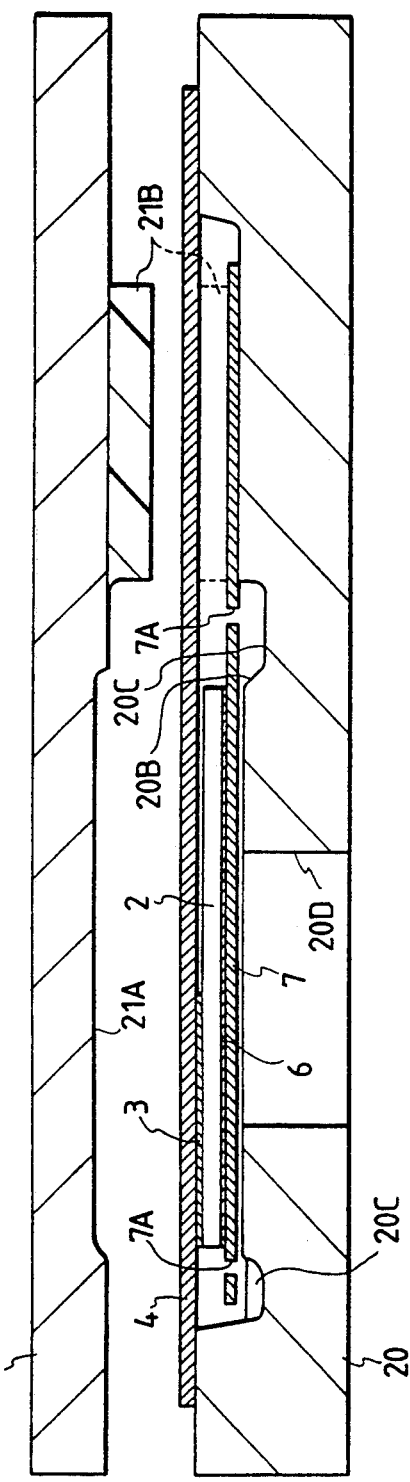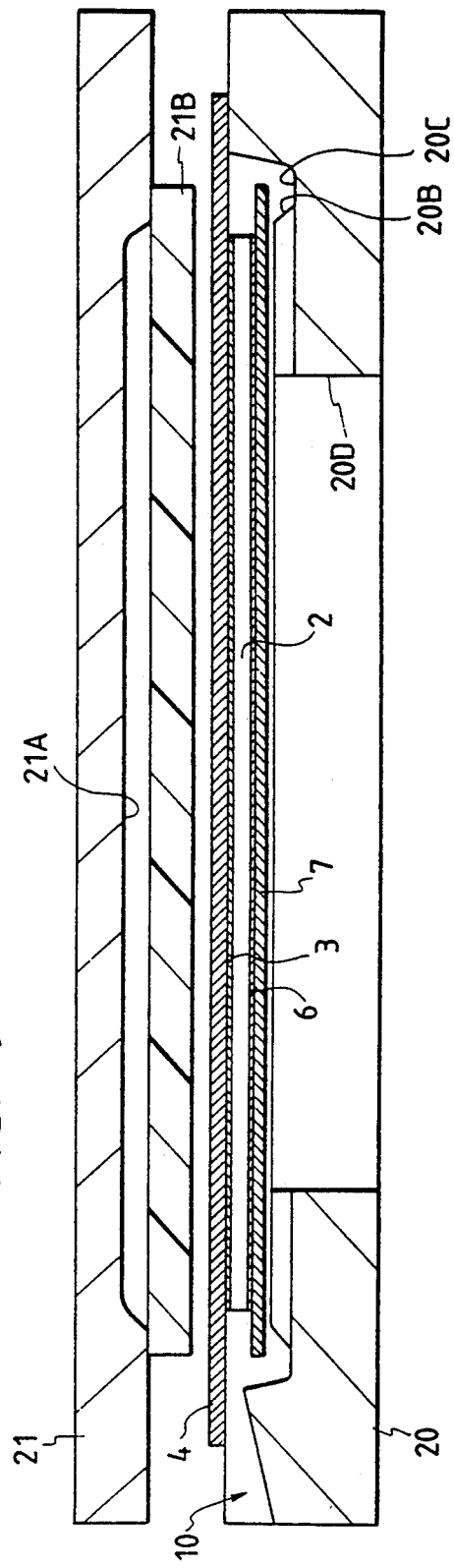

SEMICONDUCTOR DEVICE AND AN ELECTRONIC DEVICE WITH THE SEMICONDUCTOR DEVICES MOUNTED THEREON

This application is a continuation of application Ser. No. 742,197 now abandoned, filed on Aug. 5, 1991, which is a continuation of application Ser. No. 491,819 now abandoned, filed on Mar. 12, 1990.

BACKGROUND OF THE INVENTION

The present invention relates to an art which is effectively applicable to a resin mold type semiconductor device and an electronic device mounting the semiconductor devices thereon.

Memory units of large-sized high-speed computers, personal computers, and the like are constituted of semiconductor memories. DRAM (Dynamic Random Access Memory) is used especially in the semiconductor memory for achieving a larger capacity.

Since a large number of DRAMs are generally used for constructing a memory unit of a large capacity, they are constructed of resin mold type semiconductor devices which are relatively low in cost. The resin mold type semiconductor devices are arranged in the DIP (Dual in-line Package), SOP (Small Out-line Package), or ZIP (Zigzag In-line Package) structure depending on the type of mounting.

A basic structure of the resin mold type semiconductor device is such that a semiconductor pellet having thereon inner leads electrically connected with external terminals (bonding pads) is hermetically sealed with a resin. The semiconductor pellet is mounted on a tab and each of the external terminals and of the inner leads are electrically connected through a bonding wire. The resin covers the semiconductor pellet, bonding wires, tab, and inner leads. The inner leads are formed integral (electrically connected) with the outer leads (outer pins) and the outer leads are arranged to stick out of the resin.

A plurality of the resin mold type semiconductor devices of the described type are mounted on a memory board (mounting board) and incorporated in a computer as a memory unit (memory module). In mounting the resin mold type semiconductor devices (DRAMs) on a memory board, the mounting area (size) of one resin mold type semiconductor device influences the packaging density. To achieve a larger capacity (or smaller size) of a memory unit, it is required to increase the packaging density.

To solve such a technical problem, it is effective to apply an art disclosed in the gazette of Japanese Laid-open Patent Publication No. 63-52498. The art described in the gazette is such as to pile up a plurality of resin mold type semiconductor devices on a module substrate in the direction perpendicular to its mounting surface. When this art is employed, since the space above the memory board to a certain height is utilized for improving the packaging density, the provision of a large-capacity memory unit can be achieved.

SUMMARY OF THE INVENTION

The present inventor found that the following problems arise from the above described resin mold type semiconductor device and the memory unit with such devices mounted on a memory board.

(1) In the assembly work for piling up a plurality of resin mold type semiconductor devices on a memory board, such additional work is require as to align the resin mold type semiconductor devices, and the outer leads thereon, with one another. Jigs are used for improving efficiency in such alignment work. After the alignment work has been finished, a bonding agent such as solder is used and piling up (mounting) of the plurality of resin mold type semiconductor devices on the memory board is completed. Since such additional process as the alignment work is added in the assembly, the assembly work comes to take a longer time. In addition, when such work process is added, the probability of occurrence of damage such as folded outer leads becomes higher when resin mold type semiconductor devices of a DIP structure, for example, are handled.

As a result, the yield rate in the assembly work is lowered.

(2) When a plurality of resin mold type semiconductor devices are piled up on a memory board, the surroundings of the resin mold type semiconductor device on the intermediate or lower tier of the pile of devices are shielded by other resin mold type semiconductor devices. That is, the resin mold type semiconductor device on the intermediate or lower tier has a smaller surface area through which to contact the external atmosphere. Hence, heat resistance in the heat radiating path of the heat generated by operation of the semiconductor pellet is increased, and thereby, the heat radiating efficiency of the resin mold type semiconductor device is lowered.

(3) The above described resin mold type semiconductor device is covered with a resin at its entire surface including the element forming surface of the semiconductor pellet and the side reverse thereto (the side of the tab). The resin mold member is normally cooled and hardened after the molding has been performed at a high temperature. In order to reduce a warp due to thermal contraction, the resin mold member is formed such that its portion on the rear side has the same thickness as the portion on the element forming surface of the semiconductor pellet. As a result, the total thickness of the resin mold member becomes thick and, hence, there is a limit to the improvement in the packaging density.

(4) When the thickness of the resin mold member on the rear side is made smaller, a warp is produced in the resin mold member and it leads to cracks in the resin mold member, separation of the resin mold member from the semiconductor pellet, or the like. The cracks and separation act as a transmission path of moisture from outside the resin mold member to the semiconductor pellet, thereby lowering the humidity resistance of the resin mold type semiconductor device.

(5) In a resin mold type semiconductor device employing a surface mount technique of SOP structure or the like, the warping of the resin mold member causes imperfect contact between the terminals and the outer leads at a portion of the memory board. That is, the resin mold type semiconductor device invites faulty mounting.

(6) At the time of piling up a plurality of resin mold type semiconductor devices on a memory board, if there arises misalignment between any two resin mold type semiconductor devices placed on adjoining two tiers, there occurs an imperfect contact between the outer leads on these devices. That is, the resin mold type semiconductor device invites faulty mounting.

(7) If resin mold member is provided only on one side, warping is produced by temperature cycling, and thereby, a force is exerted on the bonded portion of the lead and it is possible that the wire is broken.

An object of the present invention is to provide a technology capable of improving the yield rate in the assembly work of resin mold type semiconductor devices.

Another object of the present invention is to provide a technology capable of enhancing the heat radiating efficiency of the resin mold type semiconductor device.

A further object of the present invention is to provide a technology to improve reliability on the resin-mold type semiconductor device.

Yet another object of the present invention is to provide a technology capable of increasing the packaging density in an electronic device having the resin mold type semiconductor devices mounted thereon.

An additional object of the present invention is to provide a technology capable of preventing faulty mounting in an electronic device having the resin mold type semiconductor devices mounted thereon.

The above and other objects and novel features of the present invention will become apparent from the following description with reference to the accompanying drawings.

Representative means comprising the invention disclosed herein will be summarized in the following.

(1) In a resin mold type semiconductor device having a semiconductor pellet, with external terminals electrically connected to inner leads thereon, sealed with a resin mold member, there is provided a radiating plate on the rear side opposite to the element forming surface of the semiconductor pellet, the radiating plate having a larger planar area than the rear side, and there is provided a resin mold member, which on the front side of the radiating plate mounting the semiconductor pellet thereon covers the semiconductor pellet, except for one portion of the radiating plate, and has a convex portion, and on the rear side of the radiating plate opposite to the front side has a concave portion formed so as to be engaged with the convex portion. A plurality of the resin mold type semiconductor devices are piled up in the direction vertical to the element forming surface of the semiconductor pellet. The semiconductor pellet is formed of a memory such as DRAM, SRAM, EPROM, and EEPROM.

(2) In a resin mold type semiconductor device having a semiconductor pellet, with external terminals electrically connected to inner leads thereon, sealed with a resin mold member, there is provided a radiating plate on the rear side opposite to the element forming surface of the semiconductor pellet, the radiating plate having a larger planar area than the rear side, and there is provided a resin mold member, which on the front side of the radiating plate mounting the semiconductor pellet thereon covers the semiconductor pellet and the circumferential portion of the radiating plate, except for one circumferential portion thereof, and on the rear side of the radiating plate opposite to the front side covers the circumferential portion of the radiating plate, except for one circumferential portion thereof.

(3) The radiating plate of the above described means (2) has through holes made in its circumferential portion for allowing portions of the resin mold member on the front side and on the rear side of the radiating plate to connect with each other.

(4) In a resin mold type semiconductor device having a semiconductor pellet, with external terminals electrically connected to inner leads thereon, sealed with a resin mold member, there is provided a radiating plate on the rear side opposite to the element forming surface of the semiconductor pellet, the radiating plate having a larger planar area than the rear side, and there is provided a resin mold member, which on the front side of the radiating plate mounting the semiconductor pellet thereon covers the semiconductor pellet, and which on the element forming surface of the semiconductor pellet has a thickness 1.9 to 6.0 times as large as the thickness of the radiating plate.

(5) The resin mold member of the above described means (4) is formed of a resin of epoxy group and the radiating plate is formed of a material of Cu group.

(6) The thickness of the resin mold member on the element forming surface of the semiconductor pellet of the above described means (5) is adapted to be 3.0 to 4.0 times as large as the thickness of the radiating plate.

(7) In a resin mold type semiconductor device having a semiconductor pellet, with external terminals electrically connected to inner leads thereon, sealed with a resin mold member, there is provided a resin mold member, which covers both the front side of the semiconductor pellet and the rear side thereof opposite to the front side, has a convex portion on the front side, and has, on the rear side, a concave portion in the form capable of engaging with the convex portion, and there are provided outer leads at the circumferential portion of the convex portion on the front side of the resin mold member, the outer leads being stretched round the outer edge to reach the circumferential portion of the concave portion on the rear side, and one portion of each of the outer leads placed either on the front side or the rear side being formed wider than the other portion.

(8) The outer leads of the above described means (7) on either front or rear side are provided with resiliency so that they can contact the outer leads of another resin mold type semiconductor device placed on the next tier with a suitable press.

By the above described means (1), (A) a plurality of resin mold type semiconductor devices can be piled up in the vertical direction with the convex portion and the concave portion of the resin mold members of the resin mold type semiconductor devices used as guides. The plurality of resin mold type semiconductor devices that are piled up increase two-dimensional (planar directional) packaging density of the electronic device. (B) Further, since the radiating plate projects from the resin mold member of the resin mold type semiconductor device, whereby the heat dissipating path letting out the heat from the semiconductor pellet to outside the resin mold member is secured, the heat radiating efficiency of heat generated by the operation of the semiconductor pellet can be improved. The radiating plates, when a plurality of resin mold type semiconductor devices are piled up in the vertical direction, enable the heat dissipating paths to be secured for all the resin mold type semiconductor devices, especially for the resin mold type semiconductor devices located on the intermediate tiers between the topmost and the bottommost ones, thereby improving the heat radiating efficiency of these resin mold type semiconductor devices on the intermediate tiers. (C) Further, since most of the rear side of the semiconductor pellet of the resin mold type semiconductor device is arranged to be covered not with the resin mold member, but with the radiating plate, the total thickness of the resin mold member can be made smaller. As a result, in an electronic device with a plurality of the resin mold type semiconductor devices piled up, the packaging density in the third dimension (in the vertical direction) can be increased.

By the above described means (2), in addition to the effects (B) and (C) by the means (1) described above, since the resin mold member of the resin mold type semiconductor device is arranged at the circumferential portion of the radiating plate such that it crosses over the outer edge of the radiating plate from its front side to the rear side (as if the resin mold member were biting the circumferential portion of the radiating plate), separation of the resin mold member from the radiating plate at the interface therebetween is minimized. This minimized separation contributes to the blocking up of the transmission path of moisture from outside the resin mold member to the semiconductor pellet, whereby the moisture resistance of the resin mold type semiconductor device can be improved.

By the above described means (3), in addition to the effects obtained by the means (2) above, portions of the resin mold member on the front side and on the rear side of the radiating plate are allowed to connect with each other, whereby the bonding strength between the resin mold member and the radiating plate is increased, so that separation of the resin mold member from the radiating plate at the interface is still minimized and the humidity resistance of the resin mold type semiconductor device is further improved.

By the above described means (4), an effect is obtained, in addition to the effects (B) and (C) by the means (1) described above, that the difference in coefficients of thermal expansion between the resin mold member and the radiating plate of the resin mold type semiconductor device can be set within an allowable range and the warping of the resin mold member can be reduced. Therefore, all the contacts between the terminals on the mounting board and the outer leads can be positively achieved and, as a result, faulty mounting of the resin mold type semiconductor device can be prevented.

Further, since the bonded portions of the leads of the laminated packages are kept free from a force exerting thereon, the wires can be prevented from breaking.

By the above described means (5), since the coefficients of linear expansion of the resin mold member and the radiating plate can be made virtually uniform, the warping of the resin mold member can be reduced, and thereby, faulty mounting of the resin mold type semiconductor device can be reduced. Further, since Young's modulus of the radiating plate is approximately 10 times higher than that of the resin mold member, it is made possible to reduce the thickness of the radiating plate and the size of the resin mold type semiconductor device in the vertical direction.

By the the above described means (6), the difference in the coefficients of linear expansion between the resin mold member and the radiating plate can be brought to virtually naught (it can be brought to virtually zero) and, hence, the faulty mounting of the resin mold type semiconductor device can be reduced further.

By the the above described means (7), since a portion of the outer lead of one resin mold type semiconductor device is made wider, the outer lead with the same function of another resin mold type semiconductor device placed on the level one tier up or down can have an enlarged area with which it has to contact, such an effect, in addition to the effect (A) by the above described means (1), is obtained that the electrical contact between both of the outer leads is positively achieved and imperfect electric contacts between the piled up resin mold type semiconductor devices can be prevented.

By the the above described means (8), the outer lead of one resin mold type semiconductor device provided with the resiliency can achieve a positive electrical contact with the outer lead having the same function of another device placed on the level one tier up or down and, hence, imperfect electric contacts between the piled up resin mold type semiconductor devices can be prevented.

BRIEF DESCRIPTION OF THE DRAWINGS

FIG. 1 is a sectional view of a principal portion showing a basic structure of a resin mold type semiconductor device employing a surface mount system as embodiment I of the present invention;

FIG. 2 is a side view of the resin mold type semiconductor device;

FIG. 3 is a plan view of the resin mold type semiconductor device;

FIG. 4 is a plan view of a lead frame in the assembly process of the resin mold type semiconductor device;

FIG. 5 is a plan view of components of a radiating plate of the resin mold type semiconductor device;

FIG. 8 and FIG. 9 are sectional views of metal molds in the resin molding process of the resin mold type semiconductor device;

DESCRIPTION OF THE PREFERRED EMBODIMENTS

Figure 6:
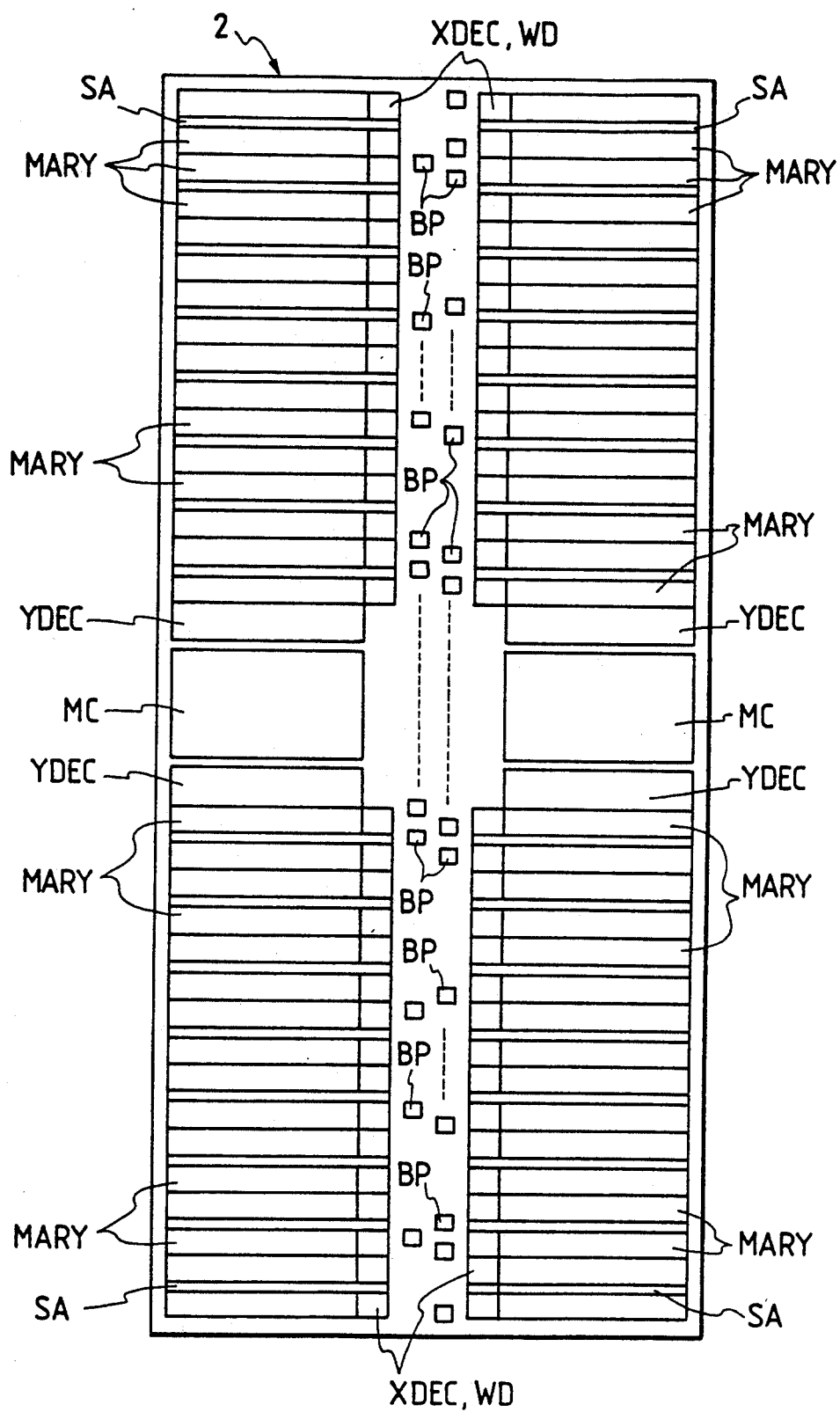
FIG. 6 is a layout diagram of a semiconductor pellet of the resin mold type semiconductor device.

Constitution of the present invention as well as embodiments with the present invention applied thereto of resin mold type semiconductor devices having a DRAM mounted on a semiconductor pellet and of electronic devices with such semiconductor devices mounted on a memory board will be described below.

Throughout the drawings describing the embodiments, parts having corresponding functions will be denoted by corresponding reference numerals and repeated explanations thereof will be omitted.

EMBODIMENT I

A basic structure of a resin mold type semiconductor device in a surface mount system as the embodiment I of the present invention is shown in FIG. 1 (a sectional view of its principal portion), FIG. 2 (a side view), and FIG. 3 (a plan view). The sectional view shown in FIG. 1 is that taken along line I—I of FIG. 3. FIG. 2 is a side view seen from the direction indicated by line II—II of FIG. 3.

As shown in FIG. 1 to FIG. 3, a resin mold type semiconductor device 1 of the present embodiment I has a plurality of outer leads (outer pins) 4B arranged on one side face on the circumference of its resin mold member 8. In other words, the resin mold type semiconductor device 1 is structured in a single in-line package in a surface mount system.

The resin mold type semiconductor device 1 is fabricated by laminating a radiating plate 7, a semiconductor pellet 2, and an array of inner leads 4A one over another as shown in FIG. 1. Between the radiating plate 7 and the semiconductor pellet 2, there is provided an insulating adhesive 6. Between the semiconductor pellet 2 and the inner leads 4A, there is provided an insulating film 3.

The inner leads 4A and outer leads 4B are formed from the same lead frame 4 as shown in FIG. 4 (a plan view of a lead frame in a fabrication process). The lead frame 4 is made in a sheet form and the inner leads 4A, outer leads 4B, etc. are formed by subjecting the lead frame 4 to punching work or etching treatment. That is, each of the inner leads 4A and each of the outer leads 4B are formed integral (connected electrically). The lead frame 4 in FIG. 4 only shows a portion of it used for a single resin mold type semiconductor device 1. The lead frame 4 in general has a region capable of providing one lead frame each to a plurality of resin mold type semiconductor devices 1. For example, it has a region for six semiconductor devices.

The inner leads 4A are formed integral, at their ends toward the outer leads 4B, with the outer leads 4B. The other ends of the inner leads 4A (toward the bonding region) are stretched, within a resin mold member 8, from one side face of the resin mold member 8 to the central portion on the element-forming surface of the semiconductor pellet 2. The outer leads 4B are formed integral, in their cental portions, with a tie bar 4C, and the tie bar 4C is formed integral with an outer frame 4E of the lead frame 4 to be supported thereby. The ends of the outer leads 4B away from the integrated side with the inner leads 4A are formed integral with an inner frame 4D of the lead frame 4 and the inner frame 4D is formed integral with the outer frame 4E to be supported thereby. Holes 4F made in the outer frame 4E of the lead frame 4 are used as holes for transporting or positioning the lead frame 4 in a process for fixing the semiconductor pellet 2 to the lead frame 4, a bonding process, and so on.

The lead frame 4 is formed, for example, of ferronickel (Fe-Ni) alloy (cotaining nickel 42%, for example) having good electric conductivity, thermal conductivity, mechanical strength, etc. The lead frame 4 is formed to have a thickness, for example, of 150 μm. The surfaces of the distal ends of the lead frame 4 on the other side of the inner leads 4A, i.e., in the the bonding area, are provided, for example, with silver (Ag) plating layer 4a to improve bondability. Instead of the aforesaid Fe-Ni alloy, Cu or Cu alloy more excellent in electric conductivity, thermal conductivity, etc. than that may be used for the lead frame 4.

Each terminal of the outer leads 4B is given a number based on standards and specified for a signal applied thereto. Since the inner leads 4A are formed integral with the outer leads 4B as described above, the signals applied to the inner leads 4A are the same as those applied to the outer leads 4B. The resin mold type semiconductor device 1 of the present embodiment I has a DRAM having a capacity as large as 16 Mbits (or 4 Mbits) as described later, though not limited thereto, mounted on a semiconductor pellet 2. Therefore, the resin mold type semiconductor device 1 in FIG. 1 to FIG. 4 has an array of terminals labeled the first terminal, the second terminal, ..., the 26th terminal from left to right. That is, the resin mold type semiconductor device 1 is provided with 26 terminals (26 pins) in all.

The signals applied to the outer leads 4B include, for example, control signals, address signals, data signals, and power supplies. The control signals include row address strobe signals $\overline{RAS}$, column address strobe signals $\overline{CAS}$, write enable signals $\overline{WE}$, and the like. The data signals include data output signals Dout and data input signals Din. The power supplies include the reference power voltage Vss, e.g., the ground potential of the circuit of 0 V, and the operating power voltage, e.g., the operating voltage of the circuit of 5 V.

The outer leads 4B has, as shown in FIG. 1 to FIG. 4, contact portions 4ba provided on the upper surface of the resin mold member 8 (on the circumference of a later described guiding convex portion 8A). The contact portion 4ba is made wider than the other portion of the outer lead 4B. When a plurality of resin mold type semiconductor devices 1 are piled up, the contact portions 4ba of one of those semiconductor devices are adapted to come into contact (electric connection) with distal end portions 4bb of the outer leads 4B of the resin mold type semiconductor device 1 place one tier up. The contact portions 4ba may otherwise be provided at the positions corresponding to the distal end portions 4bb of the outer leads 4B, that is, on the surface of the underside of the resin mold member 8 (on the circumference of a later described guiding convcave portion 8B).

The end portions 4bb of the outer leads 4B, as shown in FIG. 1, are tilted downward a predetermined angle $\theta$ from a horizontal plane (for example, they are tilted approximately 1 to 3 degrees away from a plane parallel to the underside of the radiating plate 7). More specifically, the end portion 4bb is provided with resiliency, and thereby, when a plurality of resin mold type semiconductor devices 1 are piled up, the end portion 4bb of one resin-mold type semiconductor devices 1 is enabled to suitably presses on the surface of the contact portion 4ba of the outer lead 4B of another semiconductor device placed one tier down.

The semiconductor pellet 2 is arranged in the central portion of the resin mold member 8 as shown in FIG. 3 and FIG. 4. The semiconductor pellet 2 is made of a single crystalline silicon substrate in a rectangular planar form. On the element forming surface of the semiconductor pellet 2 (the surface corresponding to the inner leads 4A), there is mounted a DRAM having a capacity of 16 Mbits as described above. The DRAM is structured in the folded bit line system (the two-intersection system). The structure of the DRAM mounted on the semiconductor pellet 2 is shown in FIG. 6 (a chip layout diagram).

As shown in FIG. 6, the DRAM mounted on the element forming surface of the semiconductor pellet 2 arranges a memory cell array MARY virtually on the entire surface of the semiconductor pellet 2. The memory cell array MARY is arranged being divided into 64 divisions in FIG. 6. Each divided memory cell array MARY has a capacity of 256 Kbits. The divided 64 memory cell arrays MARY as described above form four blocks, each thereof having 16 divisions, i.e., 16 divisions each arranged at the upper left, at the upper right, at the lower left, and at the lower right portions of FIG. 6.

Between two memory cell arrays MARY of the 64 divisions, there is arranged a sense amplifier circuit SA. At the side of each of the 64 divisions of the memory cell arrays MARY toward the center of the semiconductor pellet 2, there are arranged a row address decoder XDEC and a word driver WD, which are direct peripheral circuits.

Between the upper left and the lower left blocks of the four blocks, there are arranged column address decoder circuits YDEC, which are direct peripheral circuits, and a peripheral circuit MC. Likewise, between the upper right and the lower right blocks, there are disposed column address decoder circuits YDEC and a peripheral circuit MC. The peripheral circuits MC are indirect circuits, which include, for example, circuits of the RAS group, circuits of the CAS group, address buffer circuits, and power limiter circuits. Each of the aforesaid direct peripheral circuits and indirect peripheral circuits are basically made up of combinations of complementary MISFETs and bipolar transistors.

Between the upper left and the upper right blocks and between the lower left and the lower right blocks of the aforesaid four blocks, there are respectively arranged pluralities of external terminals (bonding pads) BP. That is, the external terminals BP are arranged at the central portion of the semiconductor pellet 2 of FIG. 6 in the lengthwise direction (from the top down) of the rectangular form.

In each of the 64 divisions of the memory cell array MARY, there are arranged a plurality of memory cells each thereof retaining information of one bit in a matrix array. Each memory cell is made up of a series circuit of a memory cell selecting MISFET and an information storing capacitive element.

The external terminal BP of the resin mold type semiconductor device 1 is electrically connected with the distal end of the inner leads 4A (the bonding area) as shown in FIG. 1. This connection is achieved using a bonding wire 5. As the bonding wire 5, a golden (Au) wire, for example, is used. The bonding wire 5 is bonded through a ball bonding method, though not limited thereto. The ball bonding is such a method that a metallic ball is formed at one end of the bonding wire 5 and the ball is bonded to the external terminal BP by thermocompression assisted by ultrasonic vibration. The other end of the bonding wire 5 is bonded to the surface of the inner lead 4A (the surface of Ag plating layer 4a) equally by the simultaneous use of thermocompression and ultrasonic vibration. As the bonding wire 5, a Cu wire or an Al wire may also be used.

The insulating film 3 provided between the inner leads 4A and the element forming surface of the semiconductor pellet 2 is chiefly for electrically insulating the two members from each other and also for bonding these members to each other. The insulating film 3 is made, for example, of polyimide resin film which is a thermosetting resin. The polyimide film is formed to be 100–300 μm thick, for example. According to the need, an adhesive layer is provided on the insulating film 3. The insulating film 3 is adapted to have substantially the same form as the planar form of the semiconductor pellet 2 shown in FIG. 3 and FIG. 4, on the area between the inner leads 4A and the semiconductor pellet 2, or only at a portion of the area which corresponds to the inner leads 4A. As described above, the resin mold type semiconductor device 1 is formed such that the inner leads 4A are stretched on the element forming surface of the semiconductor pellet 2, and such a structure is called an LOC (Lead On Chip) structure.

The radiating plate (radiating fin) 7 is provided on the rear side (opposite to the element forming surface) of the semiconductor pellet 2 as shown in FIG. 1, FIG. 3, and FIG. 5 (a plan view of parts). The radiating plate 7 is formed larger than the planar area of the semiconductor pellet 2 so as to cover virtually the total planar area of the resin mold member 8 and further projects from the resin mold member 8 in the direction away from the array of the outer leads 4B. In other words, the radiating plate 7 is sealed in the resin mold member 8 with its portion projecting from (uncovered by) the resin mold member 8. Further, the region of the radiating plate 7 mounting the semiconductor pellet 2 has the face exposed, not covered with the resin mold member 8, on the side opposite to that having the semiconductor pellet 2 thereon.

The radiating plate 7 is made of a material having a good thermal conductivity, a coefficient of linear expansion (coefficient of thermal expansion: $\alpha$) close to that of the resin mold member 8, and a high mechanical strength (Young's modulus or bending elastic modulus: E). The radiating plate 7 is made, for example, of copper (Cu: $\alpha$ is about $17 \times 10^{-6}$ [1/°C.], E is about 110,000 [MPa]). Since, as described later, the resin mold member 8 is formed from phenol curing epoxy resin ($\alpha$ is about $21 \times 10^{-6}$ [1/°C.], E is about 14,000 [MPa]), the Cu has a virtually equivalent coefficient of linear expansion to that of the resin mold member 8 and has Young's modulus approximately 10 times as high as its Young's modulus. The radiating plate 7, when formed of Cu, is provided with a thickness, for example, of about 60–180 μm. The radiating plate 7 is fabricated, for example, by subjecting a Cu plate to an etching treatment or to punching process. In the present embodiment I, a plurality of radiating plates 7 in a joint state is formed by etching a Cu plate and then individual radiating plates 7 are obtained by cutting the joining portions. Referring to FIG. 5, the joining portion 7B between the radiating plates 7 is formed in a hollowed portion made in the plate. By cutting only this joining portion 7B, no burr due to the cutting is produced on the circumference of the radiating plate 7, except for the joining portion 7B.

The radiating plate 7 reduces the thermal resistance of the thermal transmission path dissipating the internally produced heat by operation of the semiconductor pellet 2 to the outside. Thus, when a plurality of resin mold type semiconductor devices 1 are piled one above another, the heat transmission paths can be secured, especially for intermediate resin mold type semiconductor devices 1 sandwiched between the resin mold type semiconductor devices 1 on the topmost and the bottommost tiers. In addition, as described later, the portion of the resin mold member 8 below the semiconductor pellet 2 can be eliminated (replaced by the radiating plate 7), so that the resin mold member 8 can be formed thinner and the height of the resin mold type semiconductor device 1 (the size in the direction perpendicular to the element forming surface of the semiconductor pellet 2) can be made smaller.

The radiating plate 7, as shown in FIG. 1 and FIG. 5, has a plurality of through holes 7A made therein at the circumferential portion within the resin mold member 8. The through holes 7A are shaped into the form of an elongated slit arranged along the sides on the circumference of the resin mold member 8 being rectangular in the plan view and this hole is passing through the radiating plate 7 from its front side mounting the semiconductor pellet 2 and to its rear side. The through holes 7A, at the circumferential portion of the radiating plate 7 (or of the resin mold member 8), allow the portions of the resin mold member 8 on the front side of the radiating plate 7 and that on the rear side to connect with each other, whereby the bonding strength between the radiating plate 7 and the resin mold member 8 can be enhanced. The planar form of the through hole 7A is not limited to the elongated slit form as described above but it may be shaped into a rectangular, circular, or elliptic form.

It is basically preferred that the insulating adhesive 6 provided between the radiating plate 7 and the semiconductor pellet 2 is electrically nonconductive and mechanically soft (having a lower E value), so as to relax the stress due to the difference in the coefficients of linear expansion between the two members, and, in addition, excellent in thermal conductivity. As the insulating adhesive 6, silicone rubber is used for example. It is difficult to apply the silicone rubber extremely thick, but if it is applied extremely thin, there are formed voids therein or its ability to relax the stress becomes insufficient. Therefore, it is applied in a thickness, for example, of 10-30 $\mu$m. The insulating adhesive 6 is applied virtually in the same form and size as the planar form of the semiconductor pellet 2 shown in FIG. 3, FIG. 4, and FIG. 5 (or, when alignment is necessary in the assembly process, slightly larger than that, correspondingly).

The resin mold member 8, as shown in FIG. 1 to FIG. 5, chiefly covers the semiconductor pellet 2, the inner leads 4A, a portion of the radiating plate 7. More specifically, on the front side of the radiating plate 7, except for the portion of the radiating plate 7 projecting outward, the resin mold member 8 is provided at the circumferential portion of the radiating plate 7 (at the circumferential portion outer than the through holes 7A), on the surface of the radiating plate 7, and on the surface of the semiconductor pellet 2. The front side of the resin mold member 8 is formed at its central portion into a guiding convex portion 8A having a trapezoidal vertical section. The guiding convex portion 8A is provided, with a stepped form produced by the thickness of the semiconductor pellet 2 utilized, by shaping the resin mold member 8 such that its surface is spread virtually along the stepped form. In the present embodiment I, the resin mold member 8 on the element forming surface of the semiconductor pellet 2 is formed to be, for example, about 350 $\mu$m thick, and the guiding convex portion 8A is formed to be, for example, about 200 $\mu$m high. The peripheral surface of the guiding convex portion is provided with a suitable taper angle (for example, at 45 degrees), so that, when one resin mold type semiconductor device 1 is to be placed on another or when one resin mold type semiconductor device 1 is to be separated from the one thereunder, such operation is smoothly performed.

On the rear side of the radiating plate 7, equally excepting the part of the radiating plate 7 projecting outward, the resin mold member 8 is provided at the circumferential portion of the radiating plate 7 (in the area covering the through holes 7A). More specifically, the resin mold member 8 is provided with a crossover portion 8C which is spread round the outer edge of the radiating plate 7 from its front side to rear side. The rear side of the resin mold member 8 is formed at its central portion into a guiding concave portion 8B with a trapezoidal vertical section, which is made up of the radiating plate 7 and the resin mold member 8. The guiding concave portion 8B has a form to engage with the guiding convex portion 8A, that is, it is shaped into virtually the same form as the guiding convex portion 8A. The resin mold member 8 on the rear side at the circumferential portion of the radiating plate 7 is formed, for example, to be about 400 $\mu$m in thickness and the guiding concave portion 8B is formed, for example, to be about 200 $\mu$m in depth. The same as the guiding convex portion 8A, the guiding concave portion 8B has a suitable taper angle at its peripheral face so that smooth work as described above can be performed.

The resin mold member 8 is formed, for example, of phenol curing epoxy resin. To the phenol curing epoxy resin is added silicone rubber and filler. A small amount of the silicone rubber added to the phenol curing epoxy resin lowers its coefficient of elasticity. The filler, formed of silicon oxide particles in spherical form, added to the resin lowers the coefficient of its thermal expansion.

Figure 7:
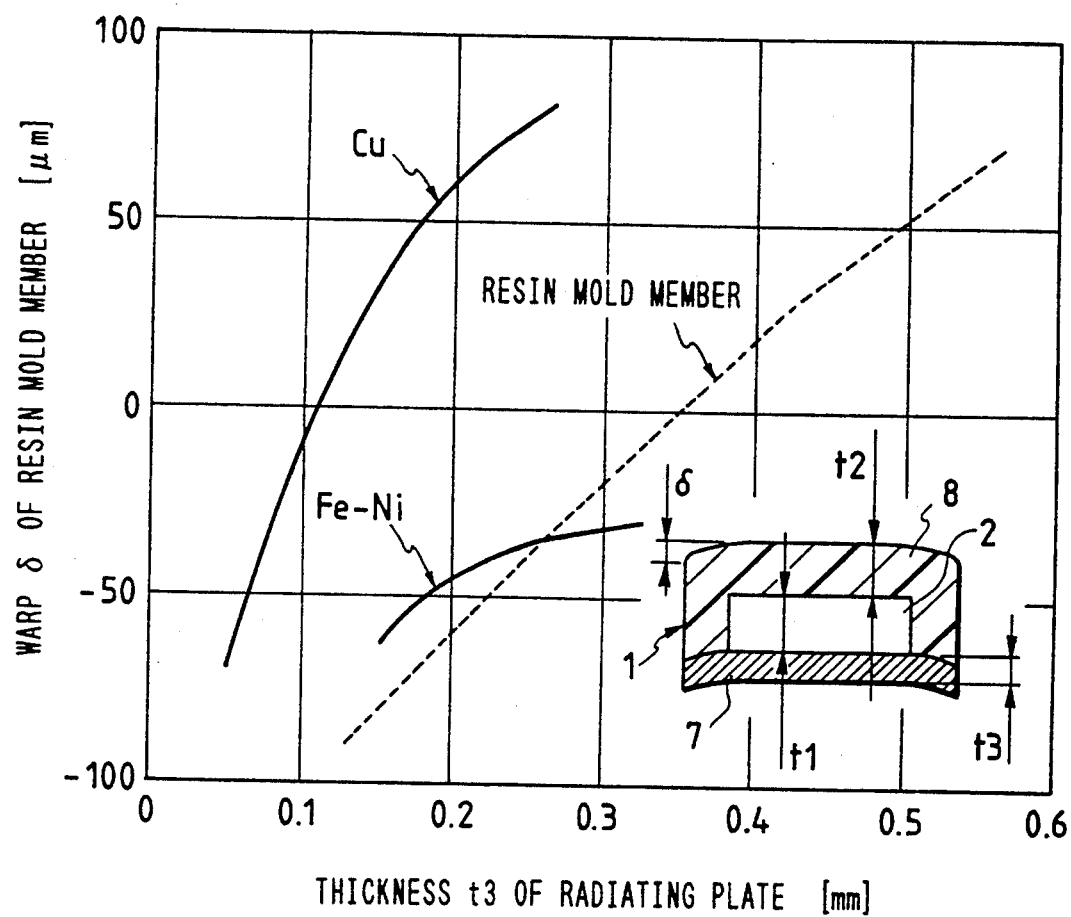
FIG. 7 is a graph showing relationships between the thickness of radiating plates and the warp of resin mold members.

The resin mold type semiconductor device 1 constructed as described above has a radiating plate 7 provided on the underside of semiconductor pellet 2, instead of the resin mold member 8, whereby the resin mold member 8 is made thinner and, in addition, warping of the resin mold member 8 due to its small thickness is prevented. FIG. 7 shows the relationships between the thickness of the radiating plate 7 of the resin mold type semiconductor device 1 and the warp of the resin mold member 8. Referring to FIG. 7, the axis of abscissa represents the thickness t3 [mm] of the radiating plate 7 and the axis of ordinate represents the warp $\delta$ [$\mu$m] of the resin mold member 8. In the schematic diagram showing the resin mold type semiconductor device 1 in FIG. 7, t1 represents the thickness of the semiconductor pellet 2, and the thickness t1 is set to 400 $\mu$m. The character t2 represents the thickness of the resin mold member 8, and the thickness t2 is set to 350 $\mu$m. In the present embodiment I, a DRAM of a capacity as large as 16 Mbits is mounted on the semiconductor pellet 2 and the area occupied by the semiconductor pellet 2 accounts for a large percentage of the total area occupied by the resin mold member 8. In the resin mold type semiconductor device 1 of the described type, the warp $\delta$ of the resin mold member 8 is determined by the thickness t2 of the resin mold member 8 on the element forming surface of the semiconductor pellet 2. More specifically, the warp $\delta$ is not virtually affected by the thickness t1 of the semiconductor pellet 2 and the thickness of the resin mold member 8 at the circumferential portion of the semiconductor pellet 2, but it is virtually unanimously determined by the thickness t3 of the radiating plate 7 and the thickness t2 of the resin mold member 8 on the element forming surface of the semiconductor pellet 2.

As shown in FIG. 7, in a resin mold member 8, which has been molded at a high temperature of 175° C. and cooled and cured at a normal temperature of 25° C., dominant thermal contraction occurs in the resin mold member 8 when the thickness t3 of the radiating plate 7 is thin, and thereby, warping toward the side of the resin mold member 8 occurs (the warp δ becomes negative). In contrast, when the thickness t3 of the radiating plate 7 is thick, Young's modulus of the radiating plate 7 becomes dominant so that warping toward the side of the radiating plate 7 is produced (the warp δ becomes positive). When the warp δ exceeds ±50 μm in the resin mold type semiconductor device 1 of the present embodiment I, the flatness is impaired, and when such a device is mounted on a mounting substrate, a failure in mounting, that is, non-contact of some of the outer leads 4B, occurs. When the radiating plate 7 is formed of Cu as described above, the thickness t3 of the radiating plate 7 is required to be approximately 60-180 μm to obtain good flatness with the warp δ of the resin mold member 8 limited within the range of ±50 μm. That is, the thickness t2 of the resin mold member 8 must be set to be 1.9 to 6 times as large as the thickness t3 of the radiating plate 7. Further, in order to substantially eliminate the warp δ of the resin mold member 8 (to keep the warp δ to be virtually zero), the thickness t3 of the radiating plate 7 must be set to approximately 80-120 μm, that is, the thickness t2 of the resin mold member 8 must be set to be 3.0-0.4 times as large as that of the radiating plate 7.

If the radiating plate 7 has not been provided, and the underside of the semiconductor pellet 2 has been formed of the resin mold member 8, instead, and if it is desired to eliminate the warp δ, then, the resin mold member 8 on the underside must be formed, as shown in FIG. 7, in the thickness equivalent to the thickness t2 of the resin mold member 8 on the element forming surface of the semiconductor pellet 2.

As shown in FIG. 7, a radiating plate 7 formed of Fe-Ni alloy can also reduce the warp δ similarly to that formed of Cu. However, since the Fe-Ni alloy has larger Young's modulus than Cu, the warp δ cannot be limited to a desired value unless the plate is formed thicker than 200 μm. In other words, by forming the radiating plate 7 of Cu, the warp δ can be sufficiently decreased even if the plate is made thinner, and it has a feature to enable the resin mold member 8 to be made thinner.

Brief description of the resin molding of the resin mold type semiconductor device 1 will be given below with reference to FIG. 8 and FIG. 9 (sectional views of metal molds in the resin molding process). FIG. 8 shows a section of the resin mold type semiconductor device 1 and a section of the metal molds seen in the same direction as that for FIG. 1. FIG. 9 shows a section of the resin mold type semiconductor device 1 and a section of the metal molds seen in the same direction as that for FIG. 2.

As shown in FIG. 8 and FIG. 9, the molds for forming the resin mold member 8 of the resin mold type semiconductor device 1 is made up of a lower mold 20 and an upper mold 21. The lower mold 20 shapes the form of the resin mold member 8 lower than the lead frame 4. More specifically, the lower mold 20 has a cavity accommodating all of the bodies of the semiconductor pellet 2 and the radiating plate 7 and has a portion 20B for shaping the guiding concave portion 8B and a portion 20C for shaping the crossover portion 8C.

The lower mold further has an air vent 20D for deaerating the cavity during the resin molding process. Since the resin mold type semiconductor device 1 employs the LOC structure and most of the resin mold member 8 is present under the lead frame 4 since the portion of the resin mold member 8 lower than the lead frame 4 has a complicated form than the portion above it, the lower mold 20 is provided with a resin gate (through which resin is injected) 10. As shown in FIG. 4, the resin gate 4 is provided in the region where any of the inner leads 4A and outer leads 4B and the radiating plate 7 are not disposed.

The upper mold 21 is for shaping the form of the resin mold member 8 above the lead frame 4. More specifically, the upper mold 21 has a cavity for shaping the guiding convex portion 8A, i.e., it has a region 21A for shaping the guiding convex portion 8A. Further, the upper mold is provided with resin stoppers 21B for holding the radiating plate 7 therebetween during the resin molding process and regulating the shape of the peripheral surface of the resin mold member 8 on the side toward the projecting portion of the radiating plate 7.

Figure 10:
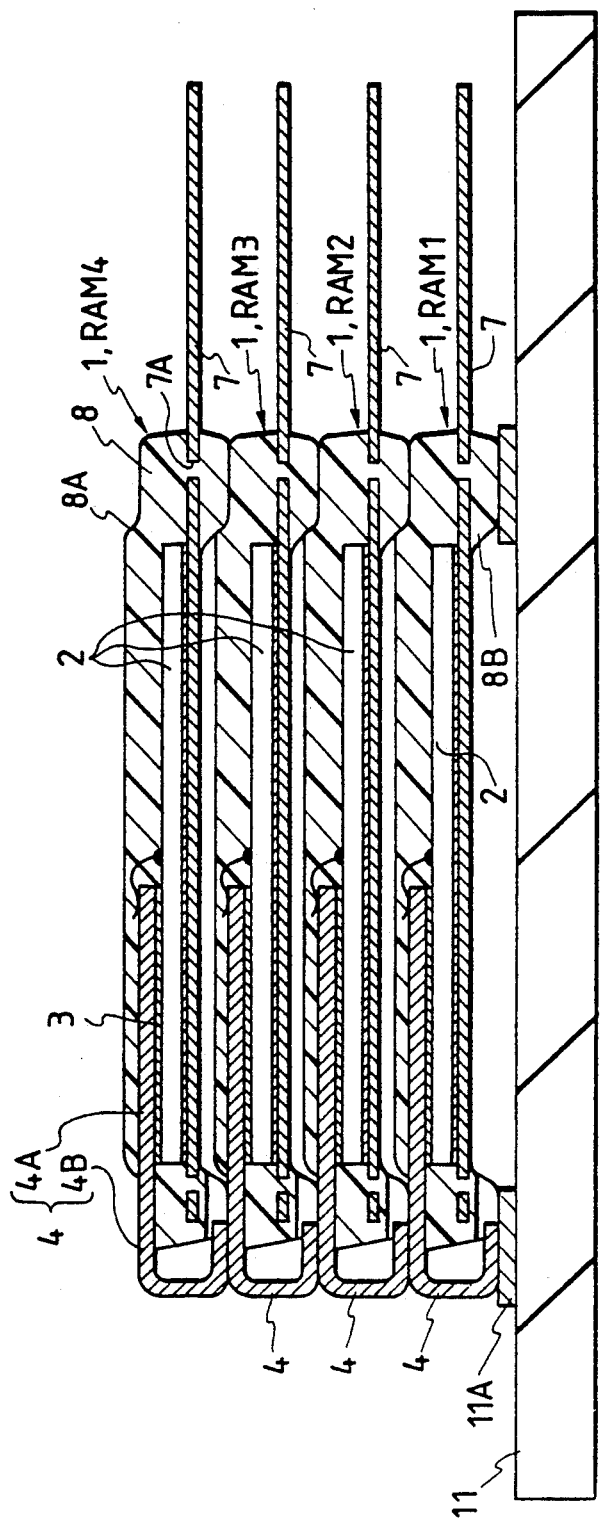
FIG. 10 is a sectional view of a principal portion of a memory unit with the resin mold type semiconductor device mounted on a memory board.

A plurality of the resin mold type semiconductor devices 1 structural as described above are mounted on a memory board (mounting substrate) 11 in a stacked up state as shown in FIG. 10 (a sectional view of a principal portion of a memory unit), thereby constituting a memory module. In the present embodiment I, four resin mold type semiconductor devices 1, through not limited to this number, are stacked in the vertical direction to the mounting surface of the memory board 11 one above another. The bottommost resin mold type semiconductor devices (RAM 1) 1 of the stacked devices have the outer leads 4B brought in direct contact with terminals 11A on the memory board 11 to be electrically connected (fixed). The resin mold type semiconductor device (RAM 2) 1 on the second tier is mounted with its guiding concave portion 8B fit on the guiding convex portion 8A of the bottommost resin mold type semiconductor device (RAM 1) 1. When the mounting is complete, the outer leads 4B having the same function of the resin mold type semiconductor devices 1 on the first tier and second tier each are put in contact and electrically connected with each other. In like manner, the resin mold type semiconductor device (RAM 3) 1 on the third tier and the resin mold type semiconductor device (RAM 4) 1 on the fourth tier are mounted one after another.

Figure 11:
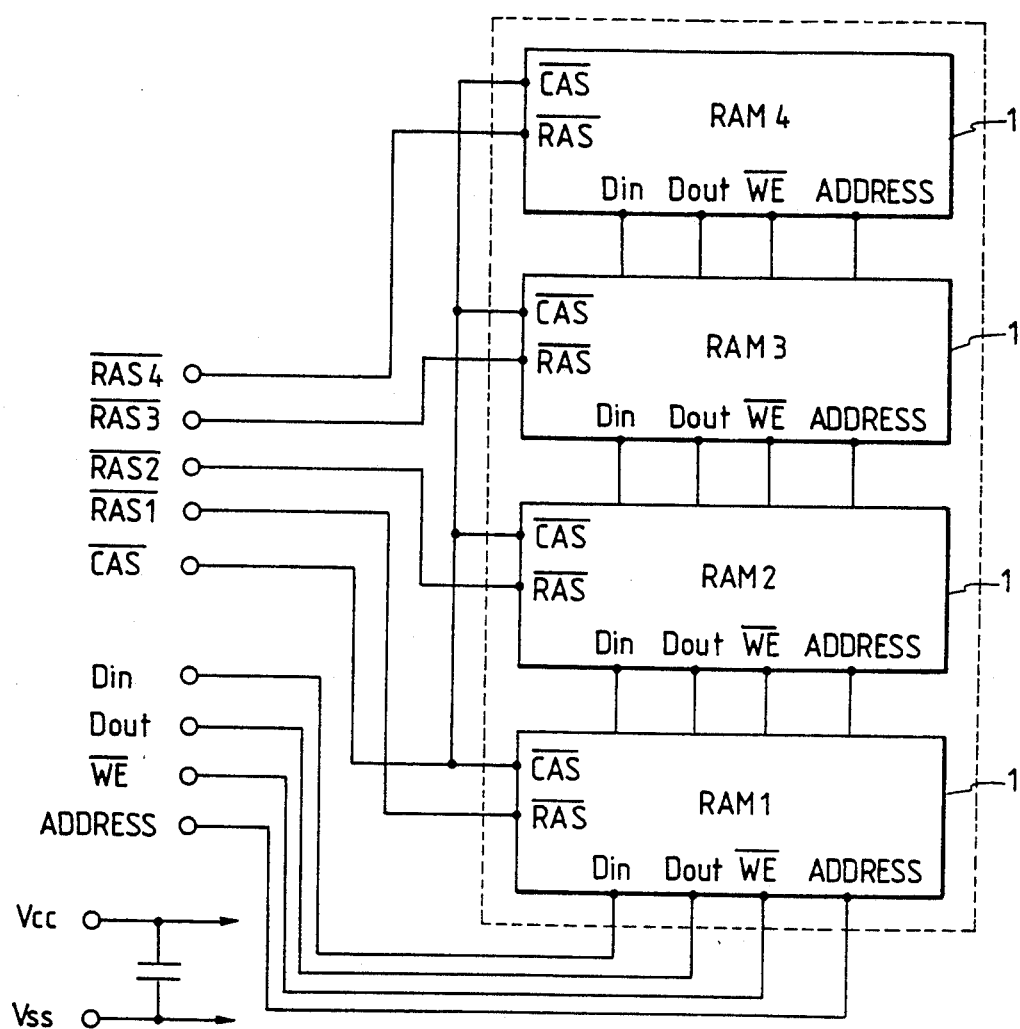
FIG. 11 is a system block diagram of the memory unit.

As shown in FIG. 11 (a system block diagram), the stacked four resin mold type semiconductor devices 1 receive, as common signals, each of control signals except for the row address strobe signal $\overline{RAS}$, data signals, address signals, and power supply signals. More specifically, the outer leads 4B arranged in the corresponding positions of the stacked four resin mold type semiconductor devices 1 are supplied with the same signals. The row address strobe signal $\overline{RAS}$, as a chip selection signal, is independently supplied to each of the resin mold type semiconductor devices 1. More specifically, a row address strobe signal $\overline{RAS1}$ is supplied to the bottommost resin mold type semiconductor device (RAM 1) 1, ..., and a row address strobe signal $\overline{RAS4}$ is supplied to the topmost resin mold type semiconductor device (RAM 4) 1. Since four resin mold type semiconductor devices 1 are piled up in the present embodiment I, each resin mold type semiconductor devices 1 is provided with four outer leads 4B to which the row address strobe signal $\overline{RAS}$ can be supplied. The outer leads 4B of each of the piled resin mold type semiconductor devices 1 disposed in the corresponding position is supplied with the same row address strobe signal $\overline{RAS}$. For inputting one of the four row address strobe signals $\overline{RAS}$ to a specific resin mold type semiconductor device 1, its inner lead 4A formed integral with the outer lead 4B is bonded to its corresponding external terminal BP through a bonding wire 5. Those inner leads 4A to which the remaining three row address strobe signals $\overline{RAS}$ are not to be substantially input are not bonded. For example, the row address strobe signals $\overline{RAS1}$ are equally applied to semiconductor devices 1, but only the inner lead 4A of the bottommost resin mold type semiconductor device 1 to be supplied with the row address strobe signal $\overline{RAS1}$ is bonded to its external terminal BP, while other such bonding is not preformed for the other resin mold type semiconductor devices 1, and thereby, only the bottommost resin mold type semiconductor device 1 is supplied with the row address strobe signal $\overline{RAS1}$. The above described memory module may also be arranged such that column address strobe signal $\overline{CAS}$ is used for the chip selection signal and other signals are used for common signals. Otherwise, in the memory module, data signals (Din and Dout) may be supplied independently to each of the piled resin mold type semiconductor devices 1 (as the chip selection signal) with the other signals, such as control signals, address signals, and the power supply, supplied to the module as common signals.

As described so far (1) in the resin mold type semiconductor device 1 having the semiconductor pellet 2, with the external terminals BP electrically connected to the inner leads 4A thereon, sealed with the resin mold member 8, there is provided, on the rear side of the semiconductor pellet 2 opposite to the element forming surface, the radiating plate 7 having a larger planar area than the rear side, and there is provided the resin mold member 8, which on the front side of the radiating plate 7 mounting the semiconductor pellet 2 thereon covers the semiconductor pellet 2, except for its one portion, and has the guiding convex portion 8A, and on the rear side opposite to the front side of the radiating plate 7 has the guiding concave portion 8B formed so as to be engaged with the guiding convex portion 8A. A plurality of the resin mold type semiconductor devices 1 are piled up in the direction vertical to the element forming surface of the semiconductor pellet 2. With the described arrangement, (A) a plurality of resin mold type semiconductor devices 1 can be piled up in the vertical direction with the guiding convex portion 8A and the guiding concave portion 8B of the resin mold members 8 of the resin mold type semiconductor devices 1 used as guides. The plurality of resin mold type semiconductor devices 1 that are piled up increase two-dimensional (planar directional) packaging density of the memory module (electronic device). (B) Further, since the radiating plate 7 projects from the resin mold member 8 of the resin mold type semiconductor device, whereby the heat dissipating path letting out the heat from the semiconductor pellet 2 to outside the resin mold member 8 is secured, the heat radiating efficiency of heat generated by the operation of the semiconductor pellet 2 can be improved. The radiating plates 7, when a plurality of resin mold type semiconductor devices 1 are piled up in the vertical direction, enable the heat dissipating paths to be secured for all the resin mold type semiconductor devices 1, especially for the resin mold type semiconductor devices 1 located on the intermediate tiers between the topmost and the bottommost ones, thereby improving the heat radiating efficiency of the resin mold type semiconductor devices 1 located on the intermediate tiers. (C) Further, since most of the rear side of the semiconductor pellet 2 of the resin mold type semiconductor device 1 is arranged to be covered not with the resin mold member 8, but with the radiating plate 7, the thickness of the resin mold member 8 is made smaller. As a result, in a module with a plurality of the resin mold type semiconductor devices 1 piled up, the packaging density in the third dimension (in the vertical direction) can be increased.

(2) In the resin mold type semiconductor device 1 having the semiconductor pellet 2, with the external terminals BP electrically connected to the inner leads 4A thereon, sealed with the resin mold member 8, there is provided, on the rear side of the semiconductor pellet 2 opposite to the element forming surface, the radiating plate 7 having a larger planar area than the rear side, and there is provided the resin mold member 8, which on the front side of the radiating plate 7 mounting the semiconductor pellet 2 thereon covers the semiconductor pellet 2 and the circumferential portion of the radiating plate 7, except for one circumferential portion thereof, and on the rear side opposite to the obverse side of the radiating plate 7 covers the circumferential portion of the radiating plate 7, except for one circumferential portion thereof. By such arrangement, in addition to the effects (B) and (C) of the structure (1) described above, since the resin mold member 8 of the resin mold type semiconductor device 1 is arranged at the circumferential portion of the radiating plate 7 such that it crosses over the outer edge of the radiating plate 7 from its front side to the rear side (as if the resin mold member 8 were biting the circumferential portion of the radiating plate 7), separation of the resin mold member 8 from the radiating plate 7 at the interface therebetween is minimized. This minimized separation contributes to the blocking up of the transmission path of moisture from outside the resin mold member 8 to the semiconductor pellet 2, whereby the moisture resistance of the resin mold type semiconductor device 1 can be improved.

(3) In the radiating plate 7 in the structure as described in (2) above, there are made through holes 7A for allowing portions of the resin mold member 8 on the front side of the radiating plate 7 and that on the rear side thereof to connect with each other. By this arrangement, in addition to the effects obtained by the structure (2) above, portions of the resin mold member 8 on the front side and on the rear side of the radiating plate 7 are allowed to connect with each other, whereby the bonding strength between the resin mold member 8 and the radiating plate 7 is increased, so that separation of the resin mold member 8 from the radiating plate 7 at the interface is still minimized and the humidity resistance of the resin mold type semiconductor device 1 is further improved.

(4) In the resin mold type semiconductor device 1 having the semiconductor pellet 2, with the external terminals BP electrically connected to the inner leads 4A thereon, sealed with the resin mold member 8, there is provided, on the rear side of the semiconductor pellet 2 opposite to the element forming surface, the radiating plate 7 having a larger planar area than the rear side, and there is provided the resin mold member 8, which on the front side of the radiating plate 7 mounting the semiconductor pellet 2 thereon covers the semiconductor pellet 2 and which on the element forming surface of the semiconductor pellet has a thickness t2, 1.9 to 6.0 times as large as the thickness t3 of the radiating plate 7. By this arrangement, an effect is obtained, in addition to the effects (B) and (C) of the structure (1) described above, that the difference in coefficients of thermal expansion between the resin mold member 8 and the radiating plate 7 of the resin mold type semiconductor device 1 can be set within an allowable range and the warping of the resin mold member 8 can be reduced. Therefore, all the contacts between the terminals 11A on the memory board 11 and the outer leads 4B can be positively achieved and, as a result, faulty mounting of the resin mold type semiconductor device can be prevented.

(5) In the structure (4) described above, the resin mold member 8 is formed of epoxy resin and the radiating plate 7 is formed of a Cu material. By this structure, since the coefficients of linear expansion of the resin mold member 8 and the radiating plate 7 can be made virtually uniform, the warp δ of the resin mold member 8 can be reduced, and thereby, faulty mounting of the resin mold type semiconductor devices 1 can be reduced. Further, since Young's modulus of the radiating plate 7 is approximately 10 times higher than that of the resin mold member 8, it is made possible to reduce the thickness of the radiating plate 7 and the size of the resin mold type semiconductor device 1 in the vertical direction.

(6) The thickness t2 of the resin mold member 8 on the element forming surface of the semiconductor pellet 2 in the structure (5) is adapted to be 3.0 to 4.0 times as large as the thickness t3 of the radiating plate 7. By this arrangement, the difference in the coefficients of linear expansion between the resin mold member 8 and the radiating plate 7 can be brought to virtually naught (the warp δ can be brought to virtually zero) and, hence, the faulty mounting of the resin mold type semiconductor devices 1 can be reduced further.

(7) In the resin mold type semiconductor device 1 having the semiconductor pellet 2, with the external terminals BP electrically connected to the inner leads 4A thereon, sealed with the resin mold member 8, there is provided the resin mold member 8 which covers both the front side of the semiconductor pellet 2 and the rear side thereof opposite to the front side, has the guiding convex portion 8A on the front side, and has, on the rear side, the guiding concave portion 8B formed so as to be capable of engaging with the guiding convex portion 8A, there are provided the outer leads 4B at the circumferential portion of the guiding convex portion 8A formed on the front side of the resin mold member 8, the outer leads 4B being stretched round the outer edge to reach the circumferential portion of the guiding concave portion 8B on the rear side, and there are provided contact portions 4ba for the outer leads 4B at one portion of each thereof, either on the front side or the rear side, with a larger width than the other portion. By this arrangement, since a portion of the outer lead 4B of one resin mold type semiconductor device 1 is made wider and, accordingly, the outer lead 4B with the same function of another resin mold type semiconductor device 1 placed on the level one tier up or down can have an enlarged area with which it has to contact, such an effect, in addition to the effect (A) described in the structure (1), is obtained that the electrical contact between both of the outer leads 4B is positively achieved and imperfect electric contacts between the piled up resin mold type semiconductor devices 1 can be prevented.

(8) In the structure as described in (7) above, the outer lead 4B is provided with an end portion 4bb disposed on the front side or the rear side thereof having resiliency so that the same can contact the outer lead 4B of another resin mold type semiconductor device 1 placed on the next tier with a suitable press. By this arrangement, the outer lead 4B of one resin mold type semiconductor device 1 provided with the resiliency can achieve a positive electrical contact with the outer lead 4B having the same function of another device placed on the level one tier up or down and, hence, imperfect electric contacts between the piled up resin mold type semiconductor devices 1 can be prevented.

EMBODIMENT II

The embodiment II is a second embodiment of the present invention with the external pins of the resin mold type semiconductor device of the embodiment I increased in number.

Figure 12:
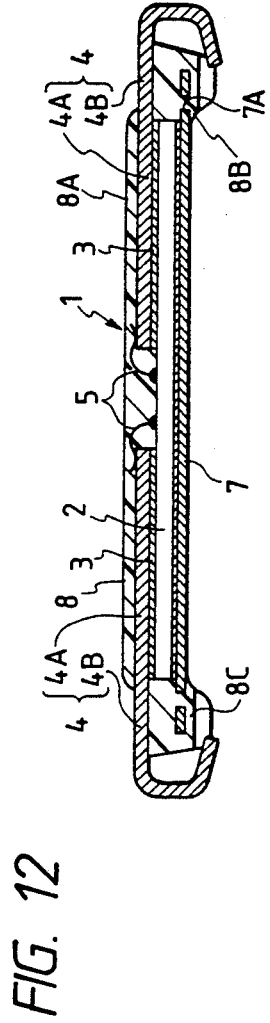
FIG. 12 is a sectional view of a principal portion of a resin mold type semiconductor device employing a surface mount system according to embodiment II of the present invention.
Figure 13:
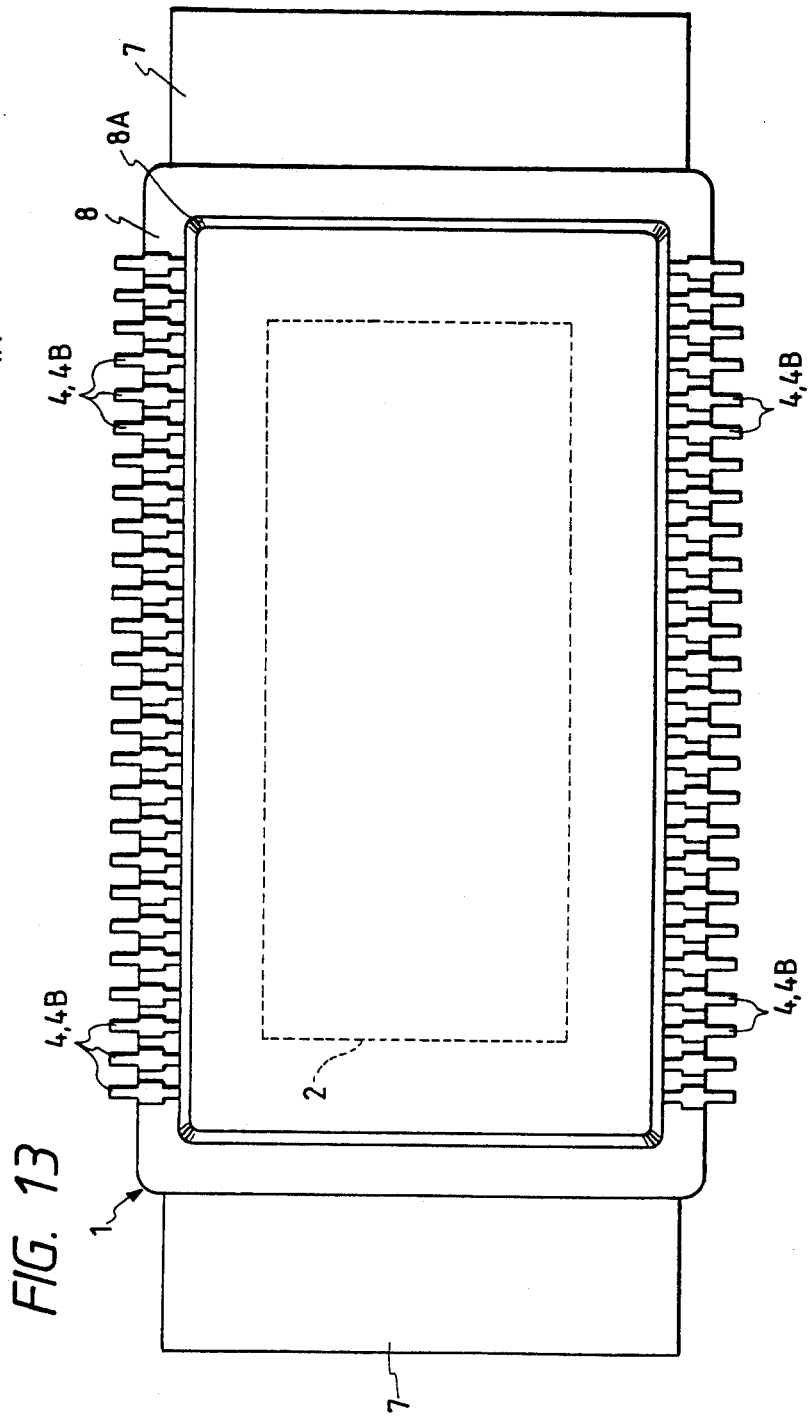
FIG. 13 is a plan view of the above mentioned resin mold type semiconductor device.

A resin mold type semiconductor device employing a surface mount system according to the embodiment II of the present invention is shown in FIG. 12 (a sectional view of its principal portion) and FIG. 13 (a plan view).

As shown in FIG. 12 and FIG. 13, the resin mold type semiconductor device 1 according to the embodiment II is basically equivalent to the embodiment I, but outer leads 4B are arranged along both of the long sides of the resin mold member 8 opposing each other. The radiating plate 7 is projecting (to be exposed) from the regions where the outer leads 4B are not arranged, that is, from the opposing short sides.

The resin mold type semiconductor device 1 structured as described above can give virtually the same effects as given by the embodiment I and, in addition, the outer leads 4B can be increased in number (pin multiplication can be achieved).

EMBODIMENT III

The embodiment III is a third embodiment of the present invention with the parasitic capacity between the semiconductor pellet and leads of the resin mold type semiconductor device of the embodiment I reduced.

Figure 14:
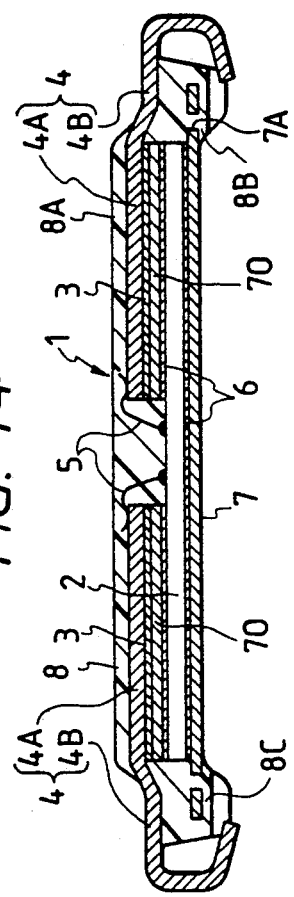
FIG. 14 is a sectional view of a principal portion of a resin mold type semiconductor device employing a surface mount system according to embodiment III of the present invention.

The resin mold type semiconductor device formed employing a surface mount system according to the embodiment III of the present invention is shown in FIG. 14 (a sectional view of a principal portion).

The resin mold type semiconductor device 1 of the embodiment III is, as shown in FIG. 14, provided with a metal plate 70 between the semiconductor pellet 2 and the inner leads 4A. Between the metal plate 70 and the semiconductor pellet 2 and between the metal plate 70 and the inner leads 4A, there are respectively provided insulating layers 3 and 6 (formed of film, silicone rubber, or the like). Though not shown, the metal plate 70 is supplied with power supply voltage, the reference power voltage Vss, for example, through the inner lead 4B and the bonding wire 5.

The thus structured resin mold type semiconductor device 1 can give virtually the same effects as given by the embodiment II. In addition to the effects, since the metal plate 70 shields electric field, an effect is obtained that parasitic capacity produced in each of the semiconductor pellet 2 and the inner leads 4A can be reduced. As a result, the speed of signals transmitted to the inner leads 4A becomes higher and a higher operating speed of the DRAM mounted on the semiconductor pellet 2 can be achieved.

Further, the metal plate 70 constitutes one of the electrodes of capacitors, the insulating layers constitute dielectric films, and the semiconductor pellet 2 and the inner leads 4A constitute the other electrodes, and as the result there are substantially formed smoothing capacitors for the power supply having the metal plate 70 as the constituent. Thus, an effect is obtained that the resin mold type semiconductor device 1 can be improved in the power supply noise margin.

EMBODIMENT IV

The embodiment IV is a fourth embodiment of the present invention with the present invention applied to a resin mold type semiconductor device of a pin-insertion type.

Figure 15:
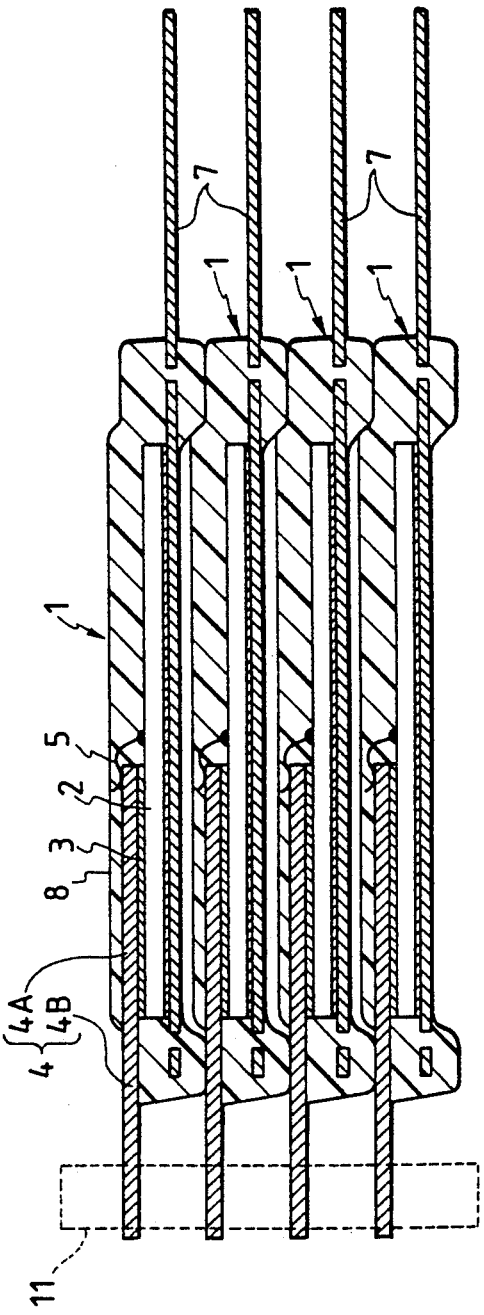
FIG. 15 is a sectional view of principal portion of a resin mold type semiconductor device employing a pin insertion system as embodiment IV of the present invention.

The resin mold type semiconductor device employing the pin-insertion system according to the embodiment IV of the present invention is shown in FIG. 15 (a sectional view of a principal portion).

The resin mold type semiconductor device 1 of the present embodiment IV, as shown in FIG. 15, is arranged in a pin-insertion type such that the outer leads 4B extended straightforward constitute the pins to be inserted. A plurality of the resin mold type semiconductor devices 1 are mounted on the memory board 11 in a laminated state as shown in FIG. 15.

The resin mold type semiconductor devices 1 can be arranged in a ZIP structure with the outer leads 4B arranged in a zigzag manner.

The thus structured resin mold type semiconductor device 1 can give virtually the same effects as given by the embodiment I.

While the invention made by the present inventor has been concretely described as related to some embodiments in the foregoing, it is apparent that the present invention is not limited to the specific embodiments but various changes and modifications may be made without departing from the spirit and scope thereof.

For example, other memories such as SRAM (Static RAM), mask ROM, EPROM, and EEPROM may be mounted on the semiconductor pellet of the above described resin mold type semiconductor device.

The present invention may be adapted such that the rear side of the radiating plate 7 under the semiconductor pellet 2 may be provided with a resin mold member 8 thinner than that in other regions.

Further, the resin mold type semiconductor device may be of such structure, different from the LOC structure, that a tab (pellet mounting portion) is used as a radiating plate with inner leads arranged at the circumferential portion of the tab, the inner leads are not directly attached to the pellet but bonding pads and inner leads are connected with wire bonding, and such members are molded into a package such that a convex portion is formed on one side of the package and a concave portion is formed on the other side thereof, whereby the module structure is completed having the resin mold type semiconductor devices piled up with the convex portion of one resin mold type semiconductor device engaged with the concave portion of another placed thereon.

Effects obtained from representative aspects of the invention disclosed herein will be summarized as follows:

Yield rate in assembly work of the resin mold type semiconductor devices can be improved.

Heat radiating efficiency of the resin mold type semiconductor device can be improved.

Moisture resistance of the resin mold type semiconductor device can be improved.

Packaging density of the resin mold type semiconductor devices mounted on electronic devices can be improved.

Faulty mounting of the resin mold type semiconductor devices on electronic devices can be prevented.

What is claimed is:

1. A semiconductor module with stacked semiconductor devices comprising:
   an upper and a lower semiconductor device, each of said semiconductor devices comprising:
   a substantially square-shaped pellet having a front surface with circuit elements and external terminals disposed thereon, a rear surface opposite to said front surface, and a side surface formed between said front and rear surfaces;
   a plurality of leads each having an inner portion and an outer portion, said outer portion comprising a first portion extending away from said pellet, a second portion extending from said first portion in a substantially parallel direction to said side surface of said pellet, and a third portion extending from said second portion toward said pellet;
   an insulating film inserted between said front surface of said pellet and a part of said inner portions of said leads wherein said inner portions of said leads are fixed to said front surface of said chip through said insulating film;
   a plurality of wires for electrically connecting said external terminals of said pellet with said inner portions of said leads; and
   a substantially square-shaped resin mold member having an upper surface located adjacent said front surface of said pellet and a lower surface located opposite to said upper surface and adjacent to said rear surface of said pellet, wherein said resin mold member seals said inner portions of said leads, said pellet and said wires,
   wherein a distance between a predetermined portion of said upper surface of said resin mold member and said first portions of said outer portions of said leads is less than a distance between a predetermined portion of said lower surface of said resin mold member and said third portions of said outer portions of said leads, and wherein said third portions of said leads of said upper semiconductor device are electrically connected to said first portions of said leads of said lower semiconductor device,
   and wherein said outer portions of said leads extend outwardly from only one side of said resin mold member.

2. A semiconductor module with stacked semiconductor devices according to claim 1, further comprising:
   a radiating plate having a first surface portion thereof fixed to said rear surface of said pellet and a second surface portion opposite to said first surface portion.

3. A semiconductor module with stacked semiconductor devices according to claim 2, wherein an end portion of said radiating plate, including an extension of said first surface portion, an extension of said second surface portion, and an end face therebetween, is arranged to project from said resin mold member.

4. A semiconductor module with stacked semiconductor devices according to claim 2, wherein said radiating plate has through-holes formed in a region surrounding a region of the radiating plate where said pellet is fixed thereto.

5. A semiconductor module with stacked semiconductor devices according to claim 1, wherein a length of said first portions of said outer portions of said leads includes a widened portion.

6. A semiconductor module with stacked semiconductor devices according to claim 1, further comprising a radiating plate having a first surface portion thereof fixed to said rear surface of said pellet and a second surface portion opposite to said first surface portion of said radiating plate,
 wherein an end portion of said radiating plate, including an extension of said first surface portion, an extension of said second surface portion, and an end face therebetween, is arranged to project from said resin mold member.

7. A semiconductor device according to claim 1, further comprising:
 a mounting substrate having a main surface and a plurality of terminals on said main surface to be electrically connected to said outer portions of said leads;
 wherein said stacked semiconductor devices are mounted on said main surface of said substrate, and wherein the front surface of said pellet is substantially perpendicular to a said main surface of said substrate.

8. A semiconductor device according to claim 1, further comprising:
 a mounting substrate having a main surface and a plurality of terminals on said main surface to be electrically connected to said outer portions of said leads;
 wherein said stacked semiconductor devices are mounted on said main surface of said substrate, and wherein the front surface of said pellet is substantially parallel to a said main surface of said substrate.

9. A semiconductor module according to claim 1, wherein said predetermined portions of said upper and lower surfaces of said resin mold member are substantially parallel to one another.

10. A semiconductor module according to claim 9, wherein said predetermined portions of said upper and lower surfaces of said resin mold member are substantially parallel to said front and rear surfaces of said pellet.

11. A semiconductor module with stacked semiconductor devices comprising:
 an upper and a lower semiconductor device, each of said semiconductor devices comprising:
 an pellet having a main surface with circuits and external terminals arranged thereon, a rear surface opposite to said main surface, and a side surface formed between said main and rear surfaces;
 a plurality of leads each having an inner portion and an outer portion;
 means for electrically connecting said external terminals of said pellet and said inner portions of said leads; and
 a substantially square-shaped resin mold member having a convex portion located above said main surface of said pellet and a concave portion located under said rear surface of said pellet, wherein said resin mold member seals said pellet, said inner portions of said leads and said electrically connecting means;
 wherein said upper semiconductor device is stacked with its concave portion fit on the convex portion of said lower semiconductor device.

12. A semiconductor module with stacked semiconductor devices according to claim 11, further comprising:
 a mounting substrate having a main surface and a plurality of terminals on said main surface to be electrically connected to said outer portions of said leads;
 wherein said stacked semiconductor devices are mounted on said main surface of said substrate.

13. A semiconductor module with stacked semiconductor devices according to claim 12, wherein said main surface of said pellet is substantially perpendicular to said main surface of said substrate.

14. A semiconductor module with stacked semiconductor devices according to claim 11, further comprising:
 a radiating plate having a first surface portion fixed to said rear surface of said pellet, a second surface portion opposite to said first surface portion of said radiating plate and an end surface portion extending between said first and second surface portions,
 wherein said second surface portion is exposed from said concave portion of said resin mold member.

15. A semiconductor module with stacked semiconductor devices according to claim 14, wherein said plurality of outer leads protrude outwardly from one side of said resin mold member, and wherein an end portion of said radiating plate, including an extension of said first surface portion, an extension of said second surface portion and said end surface portion, is arranged to project from said resin mold member in an opposite direction to a direction in which said outer leads protrude.

16. A semiconductor module with stacked semiconductor devices according to claim 15, further comprising:
 a mounting substrate having a main surface and a plurality of terminals on said main surface to be electrically connected to said outer portions of said leads;
 wherein said stacked semiconductor devices are mounted on said main surface of said substrate.

17. A semiconductor module with stacked semiconductor devices according to claim 16, wherein said main surface of said pellet is substantially perpendicular to said main surface of said substrate.

18. A semiconductor module with stacked semiconductor devices according to claim 11, further comprising:
 an insulating film inserted between said main surface of said pellet and a part of said inner portions of said leads;
 wherein said inner portions of said leads are fixed to said main surface of said pellet through said insulating film.

19. A semiconductor module with stacked semiconductor devices according to claim 18, further comprising:
 a mounting substrate having a main surface and a plurality of terminals on said main surface to be electrically connected to said outer portions of said leads, wherein said stacked semiconductor devices are mounted on said main surface of said substrate.

20. A semiconductor module with stacked semiconductor devices according to claim 19, wherein said main surface of said pellet is substantially perpendicular to said main surface of said substrate.

21. A semiconductor module with stacked semiconductor devices according to claim 18, further comprising:
    a radiating plate having a first surface portion fixed to said rear surface of said pellet, a second surface portion opposite to said first surface portion of said radiating plate, and an end surface portion extending between said first and second surface portions, wherein said second surface portion is exposed from said concave portion of said resin mold member.

22. A semiconductor module with stacked semiconductor devices according to claim 24, wherein said plurality of outer leads protrude outwardly from one side of said resin mold member, and wherein an end portion of said radiating plate, including an extension of said first surface portion, an extension of said second surface portion and said end surface portion, is arranged to project from said resin mold member in an opposite direction to a direction in which said outer leads protrude.

23. A semiconductor module with stacked semiconductor devices according to claim 22, further comprising:
    a mounting substrate having a main surface and a plurality of terminals on said main surface to be electrically connected to said outer portions of said leads,
    wherein said stacked semiconductor devices are mounted on said main surface of said substrate.

24. A semiconductor module with stacked semiconductor devices according to claim 23, wherein said main surface of said pellet is substantially perpendicular to said main surface of said substrate.

25. A semiconductor module with stacked semiconductor devices according to claim 11, wherein said outer lead portions of said leads each comprise a first portion extending away from said pellet, a second portion extending from said first portion in a substantially parallel direction to said side surface of said pellet, and a third portion extending from said second portion toward said pellet.

26. A semiconductor module with stacked semiconductor devices according to claim 25, wherein said third portions of said upper semiconductor device are connected to said first portions of said lower semiconductor device.

27. A semiconductor module with stacked semiconductor devices according to claim 26, further comprising:
    a mounting substrate having a main surface and a plurality of terminals on said main surface to be electrically connected to said outer portions of said leads;
    wherein said stacked semiconductor devices are mounted on said main surface of said substrate.

28. A semiconductor module with stacked semiconductor devices according to claim 25, further comprising:
    a radiating plate having a first surface portion fixed to said rear surface of said pellet, a second surface portion opposite to said first surface portion of said radiating plate, and an end surface portion extending between said first and second surface portions, wherein said second surface portion is exposed from said concave portion of said resin mold member.

29. A semiconductor module with stacked semiconductor devices according to claim 28, wherein said plurality of outer leads protrude outwardly from one side of said resin mold member, and wherein an end portion of said radiating plate, including an extension of said first surface portion, an extension of said second surface portion and said end surface portion, is arranged to project from said resin mold member in an opposite direction to a direction in which said outer leads protrude.

30. A semiconductor module with stacked semiconductor devices according to claim 25, further comprising:
    a radiating plate having a first surface portion fixed to said rear surface of said pellet, a second surface portion opposite to said first surface portion of said radiating plate, and an end surface portion extending between said first and second surface portions, wherein said second surface portion is exposed from said concave portion of said resin mold member.

31. A semiconductor module with stacked semiconductor devices according to claim 30, wherein said plurality of outer leads protrude outwardly from one side of said resin mold member, and said radiating plate is arranged to project from said resin mold member in a direction substantially perpendicular to a direction in which said outer leads protrude.

* * * * *